(12) United States Patent
Soeta et al.

(10) Patent No.: US 7,514,946 B2
(45) Date of Patent: Apr. 7, 2009

(54) SEMICONDUCTOR CARRIER TRAY, AND BURN-IN BOARD, BURN-IN TEST METHOD, AND SEMICONDUCTOR MANUFACTURING METHOD USING THE SEMICONDUCTOR CARRIER TRAY

(75) Inventors: Kaoru Soeta, Tokyo (JP); Masaru Uchida, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 300 days.

(21) Appl. No.: 11/378,863

(22) Filed: Mar. 17, 2006

(65) Prior Publication Data

US 2006/0208721 A1 Sep. 21, 2006

(30) Foreign Application Priority Data

Mar. 18, 2005 (JP) .............................. 2005-079936
Feb. 27, 2006 (JP) .............................. 2006-049924

(51) Int. Cl.
*G01R 31/02* (2006.01)
(52) U.S. Cl. ...................................... 324/760
(58) Field of Classification Search ................ 324/765, 324/763, 760, 761–762, 158.1, 755; 439/55, 439/67; 257/48
See application file for complete search history.

(56) References Cited

U.S. PATENT DOCUMENTS

| | | | | |
|---|---|---|---|---|
| 5,387,861 A | * | 2/1995 | Neiderhofer | 324/158.1 |
| 6,069,482 A | * | 5/2000 | Hilton | 324/755 |
| 6,724,213 B2 | * | 4/2004 | Ito et al. | 324/765 |
| 7,142,000 B2 | * | 11/2006 | Eldridge et al. | 324/765 |

FOREIGN PATENT DOCUMENTS

| | | |
|---|---|---|
| JP | H-09232057 | 9/1997 |
| JP | 2002-357622 | 12/2002 |

* cited by examiner

*Primary Examiner*—Ha Tran T Nguyen
*Assistant Examiner*—Tung X Nguyen
(74) *Attorney, Agent, or Firm*—Brinks Hofer Gilson & Lione

(57) ABSTRACT

By mounting a semiconductor carrier tray in an accommodating portion of a housing of a burn-in board and then closing a lid member, a large number of semiconductors can be placed on the burn-in board. By putting the burn-in board in this state into a burn-in tester, the plurality of semiconductors can be collectively tested. Accordingly, the semiconductors and sockets for holding the semiconductors need not be provided in the one-to-one relation, whereby a larger number of semiconductors can be tested at once.

5 Claims, 14 Drawing Sheets

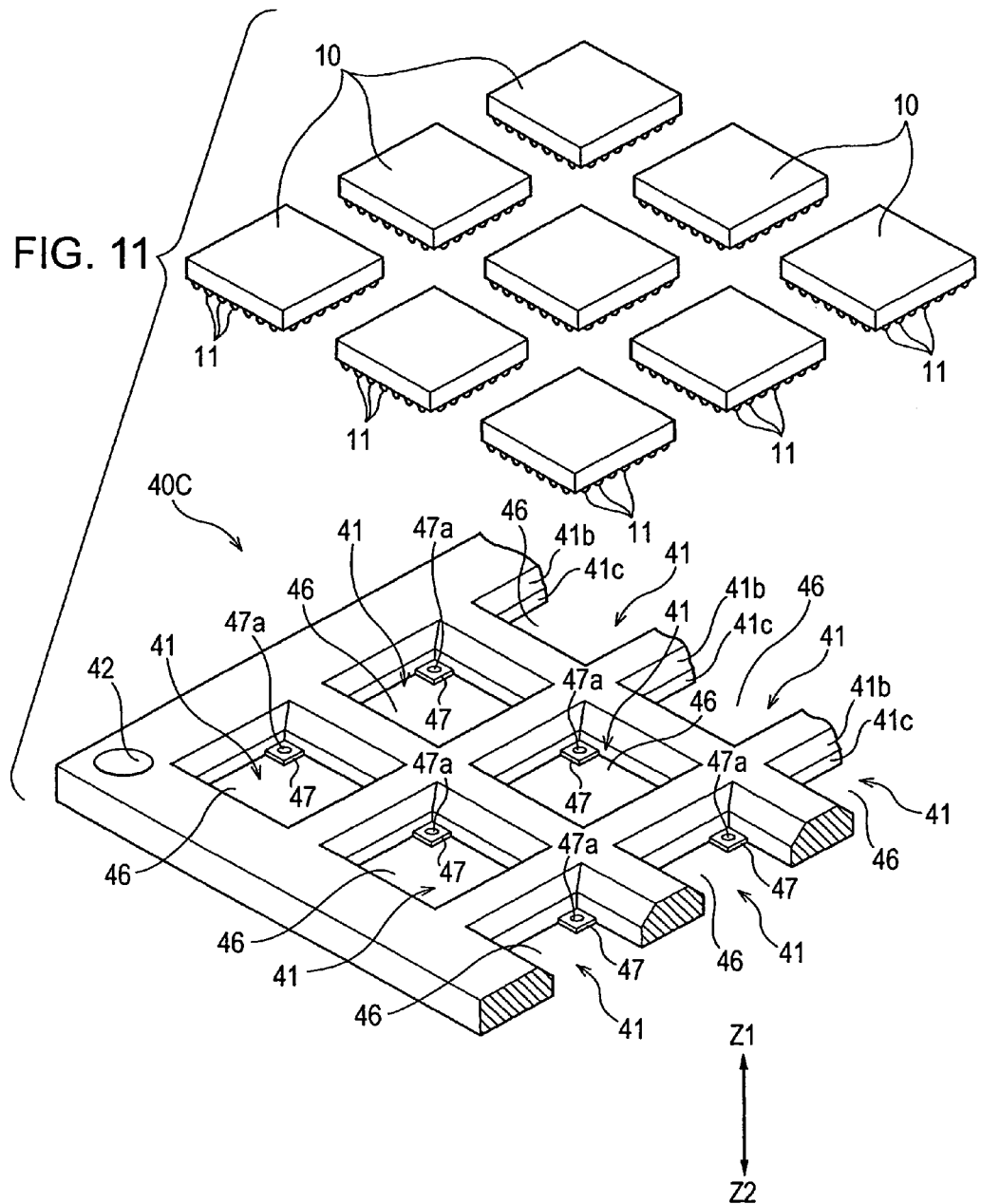

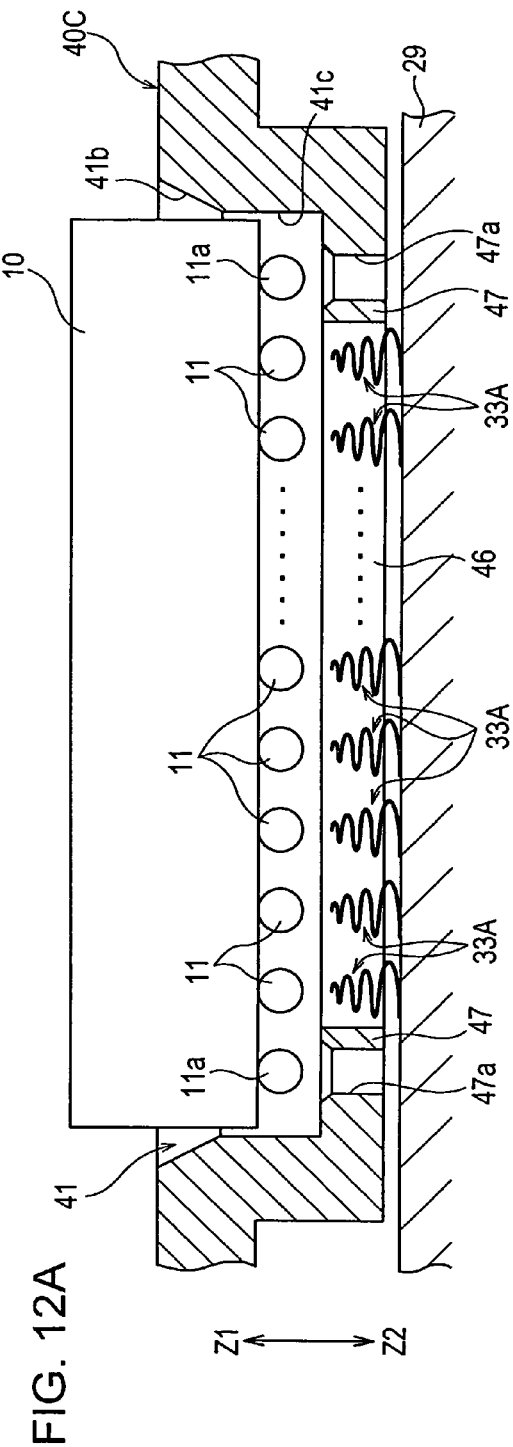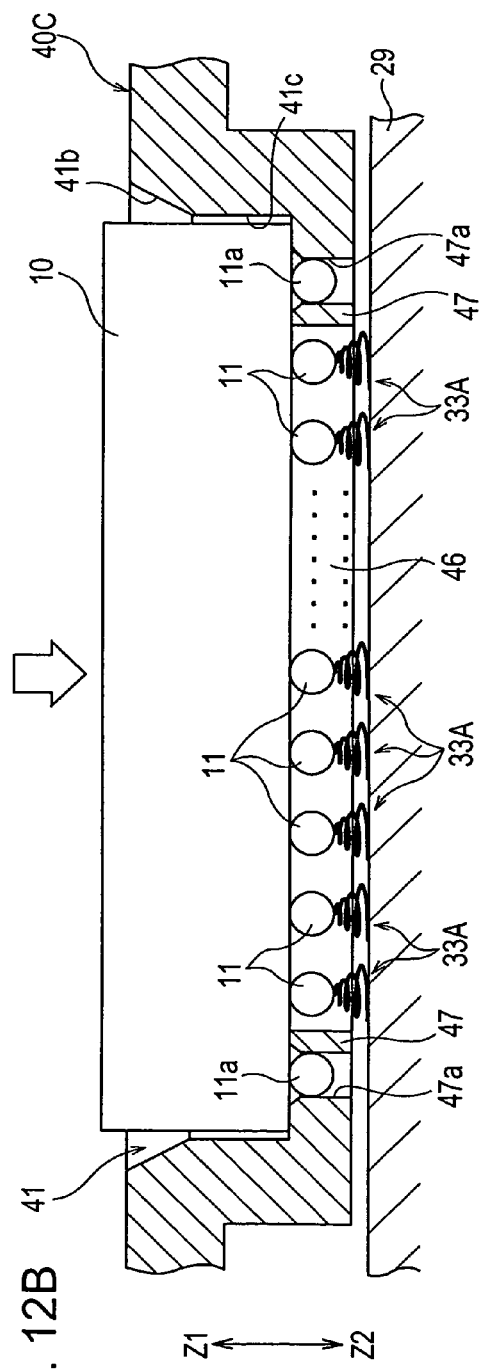

SEMICONDUCTOR CARRIER TRAY, AND BURN-IN BOARD, BURN-IN TEST METHOD, AND SEMICONDUCTOR MANUFACTURING METHOD USING THE SEMICONDUCTOR CARRIER TRAY

BACKGROUND OF THE INVENTION

1. Field of the Invention

The present invention relates to a semiconductor carrier tray for use in a burn-in test of a semiconductor such as a CPU or memory, and to a burn-in board, a burn-in test method, and a semiconductor manufacturing method which use the semiconductor carrier tray.

2. Description of the Related Art

A burn-in test is carried out on each of individual IC packages (semiconductors) on which bare chips cut out from a wafer are mounted. A burn-in test is a continuity test for determining whether or not there is breakage or the like in the internal wiring of an IC package under a predetermined high-temperature/acceleration condition, that is, whether or not the wiring patterns are formed in conformity with the specifications. Only the IC packages that have passed the burn-in test are sent to the final operation test.

As shown in FIG. 15, in the burn-in test, inspection is conventionally carried out by accommodating individual IC packages 3 into a large number of IC sockets provided on a burn-in board 1. For instance, as shown in FIG. 15, each of the IC sockets 2 is composed of an accommodating portion 4 for accommodating the IC package 3, a lid member 5 for holding the IC package 3 inside the accommodating portion 4, the lid member 5 being applied with a force urging it toward the inner side of the accommodating portion 4, and the like. Provided on the bottom surface of the accommodating portion 4 are a large number of contact pins 6 that abut contact terminals 3a, such as BGAs (Ball Grid Array), of the IC package 3 to achieve electrical continuity.

Further, examples of publicly known documents relating to conventional IC sockets include Japanese Unexamined Patent Application Publication No. 09-232057 and Japanese Unexamined Patent Application Publication No. 2002-357622.

As described above, in the conventional burn-in board 1, the IC socket 2 is provided for each individual IC package 3. Due to the structural constraints imposed by the necessity of accommodating and holding the IC package 3, there is a limit to the downsizing of the IC socket 2. Further, since the IC socket 2 occupies a rather large area, it has been difficult to increase the number of IC sockets 2 that can be placed on the burn-in board 1 of a predetermined size than is conventionally possible. Thus, the only way to carry out a burn-in test on a larger number of IC packages at once than is conventionally possible is to increase the size of the conventional burn-in inspection device itself.

Further, the conventional burn-in test method requires, in the preparatory stages prior to the test, the operation of mounting the individual IC packages 3 one by one into the IC sockets 2 and also closing the lid member 5 for each individual IC socket 2. Further, in the post-processing stages after the test, the method requires the operation of opening the lid member 5 for each individual IC socket 2 and then extracting the individual IC packages 3 one by one. The conventional method thus has a problem in that the test takes much time and trouble.

Further, the expensive IC socket 2 must be provided for each individual IC package 3, which makes it difficult to reduce the cost of the burn-in board 1 itself.

Further, the contact pins 6 provided in the conventional IC socket 2 are of a type exerting a high contact pressure on the individual connection terminals 3a of the IC package 3. Thus, due to the necessity to reliably hold the IC package 3 in the IC socket 2, the IC socket 2 itself tends to become rather large scale and large sized in structure, and also it is difficult to apply a uniform contact pressure to all of the connection terminals 33a.

Further, in the case of the conventional so-called pogo-pin type IC socket, the load (elastic pressure) per one pin is large at about 0.294N (30 gf); accordingly, in order to uniformly connect the several hundreds of pins provided to the IC socket 2, it is necessary to press them down with a large force using the large-scale IC socket as described above. Thus, a large stress acts on the soldering portion of the burn-in board 1, and when the burn-in board 1 in such a state is placed under the high temperature environment during the burn-in test, extremely large warpage occurs in the burn-in board 1 itself.

SUMMARY OF THE INVENTION

The present invention is characterized by including a large number of receiving portions arranged in a planar matrix form, for placing and retaining thereon semiconductors each having at least one bare chip, the semiconductors being subjected to testing in a state in which the semiconductors are retained in the receiving portions.

Further, the present invention is characterized in that the receiving portions are formed in a recessed configuration.

Further, the present invention is characterized in that a bottom surface of each of the receiving portions is provided with retention holes for positioning in place projecting contact electrodes provided on a bottom surface of each of the semiconductors.

In the arrangement described above, it is preferable that the bottom portion of each of the receiving portions be provided with an opening, a semiconductor retaining portion be provided so as to protrude from an edge of the opening, and that each of the retention holes be provided in the semiconductor retaining portion. Further, it is preferable that the semiconductor retaining portion be provided in at least two corner portions of the edge of the opening.

Further, the present invention is characterized by including: a large number of receiving portions arranged in a planar matrix form and each having in a bottom surface retention holes in correspondence with projecting contact electrodes of the semiconductors; and a wall portion surrounding the receiving portions.

According to the present invention, the large number of semiconductors (IC packages) can be collectively handled at the time of their purchase, testing, shipment, and the like. Further, the individual semiconductors can be positioned at predetermined locations with high accuracy, and the projecting contact electrodes provided on the bottom surface of the semiconductors can be exposed to external contactors, thereby enabling electrical connection with the external contactors.

Further, the present invention is characterized by including: any one of the semiconductor carrier trays as described above; a base substrate having a large number of elastic contacts arranged on its surface; and a lid member arranged so as to be opposed to the base substrate, wherein the semiconductor carrier tray is detachably provided between the base substrate and the lid member.

Further, the present invention is characterized by including: any one of the semiconductor carrier trays as described above; a base substrate having a large number of elastic contacts arranged on its surface; a relay substrate having a large number of elastic contacts provided on, from among both front and back surfaces thereof, at least the front surface, the relay substrate being arranged on the base substrate; and a lid member arranged so as to be opposed to the base substrate, wherein the semiconductor carrier tray is detachably provided between the relay substrate and the lid member.

According to the present invention, by accommodating the semiconductor carrier tray in between the base substrate and the lid member, or between the relay substrate and the lid member, the large number of semiconductors can be collectively mounted onto the burn-in board.

For example, a construction may be adopted in which a housing including an accommodating portion for accommodating one or both of the relay substrate and the semiconductor carrier tray is provided on the base substrate.

In the construction described above, it is preferable that a positioning mechanism for positioning the semiconductor carrier tray be provided on the base substrate.

According to the means as described above, the semiconductor carrier tray retaining the large number of semiconductors can be accurately placed at a predetermined position on the burn-in board.

Further, for example, it is also possible to adopt a construction in which the lid member is pivotally supported on the housing.

According to the means as described above, the lid member and the housing can be integrated with each other, thereby allowing easy handling.

Further, it is preferable that locking means for fixing the lid member in position be provided.

According to the means as described above, the semiconductor carrier tray retaining the large number of semiconductors can be fixed onto the burn-in board.

It is preferable that the elastic contacts be arranged so as to be opposed to retention holes provided in the semiconductor carrier tray.

According to the means as described above, the elastic contacts on the relay substrate side and the projecting contact electrodes on the semiconductor side can be connected to each other.

Further, it is preferable that the elastic contacts be inserted into the retention holes so as to be capable of elastic deformation.

For example, a construction may be adopted in which the elastic contacts are spiral contactors each having a spiral deformation portion.

According to the means as described above, the elastic pressure force exerted by each individual spiral contactor is small, thereby allowing retention of the semiconductors having the large number of spiral contactors with a smaller retention force than in the prior art. Thus, it is possible to avoid a situation where a large stress occurs in the burn-in board. This makes it possible to prevent large warpage from occurring in the burn-in board.

Further, it is preferable that the elastic contacts be symmetrically provided on both front and back surfaces of the relay substrate. More specifically, a construction is preferred in which the elastic contacts are provided on each of the upper and lower surfaces of the relay substrate, the upper elastic contacts formed on the upper surface of the relay substrate are made to abut the projecting contact electrodes of each electronic functional element, the lower elastic contacts formed on the lower surface of the relay substrate are made to abut the contact electrodes provided on the surface of the burn-in board, and at least the upper elastic contacts are each provided with an elastic deformation portion projecting in the direction of the projecting contact electrodes. Accordingly, the contact pressure with respect to the projecting contact electrodes can be reduced. As a result, when the large number of semiconductors are placed on the burn-in board, a uniform contact pressure can be applied to the projecting contact electrodes of the respective semiconductors, thereby making it possible to collectively inspect the large number of semiconductors in an appropriate and reliable manner.

Further, it is preferable that the relay substrate be detachably provided.

According to the means as described above, only the relay substrate can be replaced at the time of performing maintenance, thereby allowing easy maintenance.

Further, a construction is preferred in which segmented small relay substrates are provided on the base substrate on a per-block basis.

According to the means as described above, only the relay substrate having a defect can be replaced, thereby preventing wastage.

Further, a burn-in test method according to the present invention is a burn-in test method for collectively testing a large number of semiconductors, characterized by including the steps of: placing a large number of semiconductors on a semiconductor carrier tray having a large number of receiving portions arranged in a planar matrix form; placing a relay substrate on a base substrate having a large number of electrodes arranged on its surface, the relay substrate having a large number of elastic contacts provided on both front and back surfaces thereof; placing the semiconductor carrier tray on the relay substrate; collectively causing projecting contact electrodes of the semiconductors to be elastically pressed against and retained by the elastic contacts, by closing a lid member arranged so as to be opposed to the relay substrate; and heating the semiconductor tray, which is elastically pressed and retained, for a predetermined period of time.

According to the present invention as described above, the large number of semiconductors placed on the semiconductor carrier tray can be collectively inspected, whereby there is no need to provide a socket for each individual semiconductor, and the inspection can be carried out on a larger number of semiconductors than is conventionally possible.

Further, a semiconductor manufacturing method according to the present invention is characterized by including the steps of: packaging bare chips cut out from a wafer into semiconductors; carrying out a test on the semiconductors; and shipping only the semiconductors that have passed the test, wherein the step of carrying out a test includes the burn-in test as described above.

According to the invention as described above, only the semiconductors that have passed the test can be shipped, thereby achieving an improvement in the yield of the semiconductors manufactured through the series of manufacturing process.

According to the present invention, a large number of semiconductors (IC packages) can be collectively handled while being retained on a single semiconductor carrier tray. Furthermore, the semiconductors can be collectively tested in this state. The time and trouble required for the preparatory stages prior to the test or the post-processing stages after the test can be reduced, whereby testing can be efficiently performed on the large number of semiconductors.

Further, as a common carrier tray shared among the three parties of the IC package manufacturer, the IC package test provider, and the personal computer manufacturer, the semiconductor carrier tray can be used in a continuous cycle. In particular, it is possible for the IC package test provider to achieve a significant improvement in operation efficiency because it is not necessary to perform the operation of attaching/detaching individual semiconductors into/from the respective sockets before and after the test.

Further, with the burn-in board according to the present invention, the semiconductor carrier tray with the large number of semiconductor retained thereon can be placed within the holding means (tray holder) on the burn-in board as it is. Accordingly, it is possible to increase the number of semiconductors per unit surface area that can be placed on the burn-in board, thereby achieving a significant increase in the number of semiconductors that can be handled during each single burn-in test. That is, the burn-in test can be carried out with efficiency.

BRIEF DESCRIPTION OF THE DRAWINGS

FIG. 11 is a partial perspective view, similar to FIG. 6, showing a semiconductor carrier tray according to a third embodiment of the present invention.

FIG. 12A is an enlarged sectional view of the portion of the semiconductor carrier tray according to the third embodiment, showing a state prior to the loading of semiconductors;

FIG. 12B is an enlarged sectional view of the portion of the semiconductor carrier tray according to the third embodiment, showing a state after the loading of the semiconductors.

DESCRIPTION OF THE PREFERRED EMBODIMENTS

Figure 1:
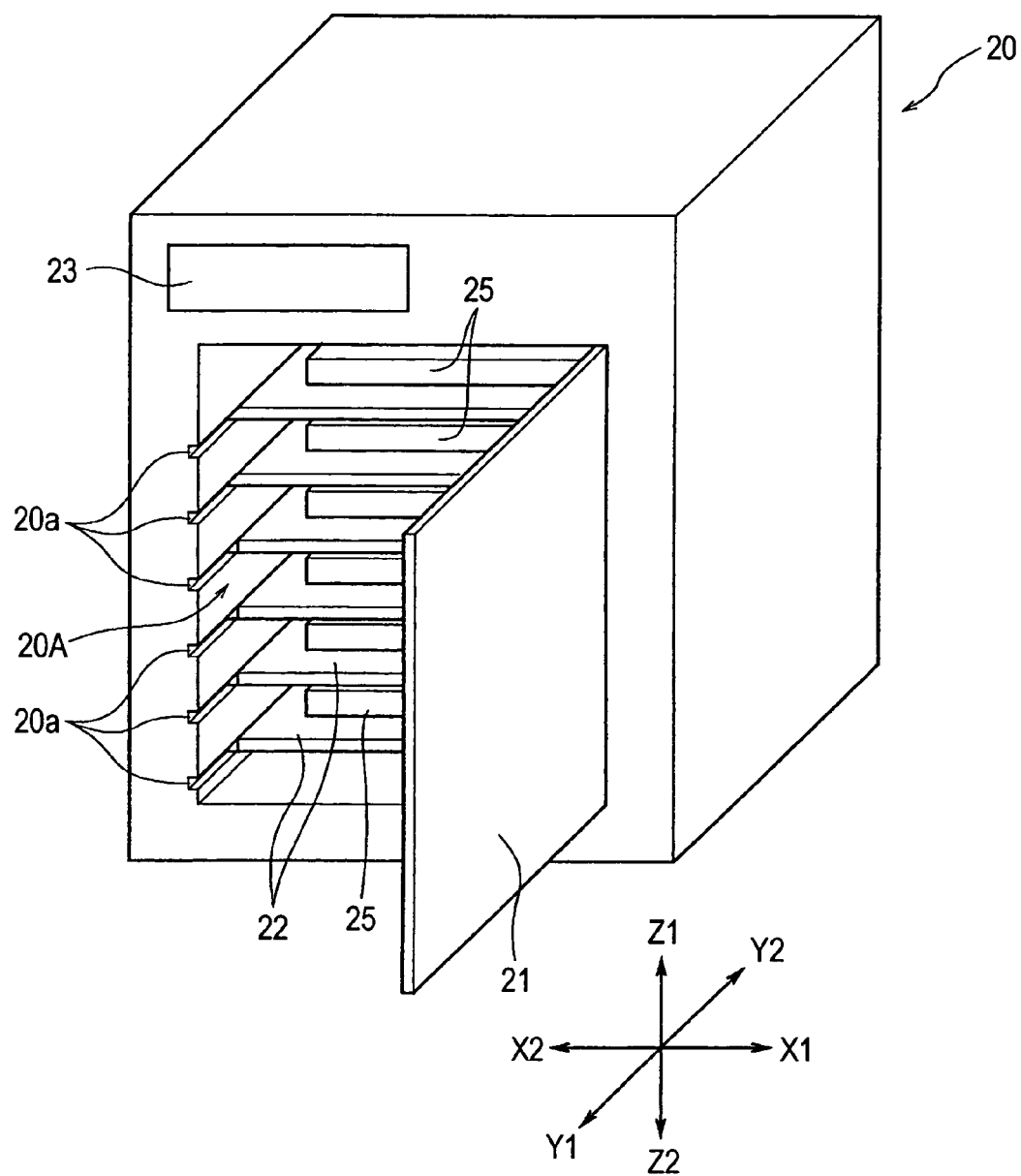
FIG. 1 is a perspective view of a burn-in tester.
Figure 2:
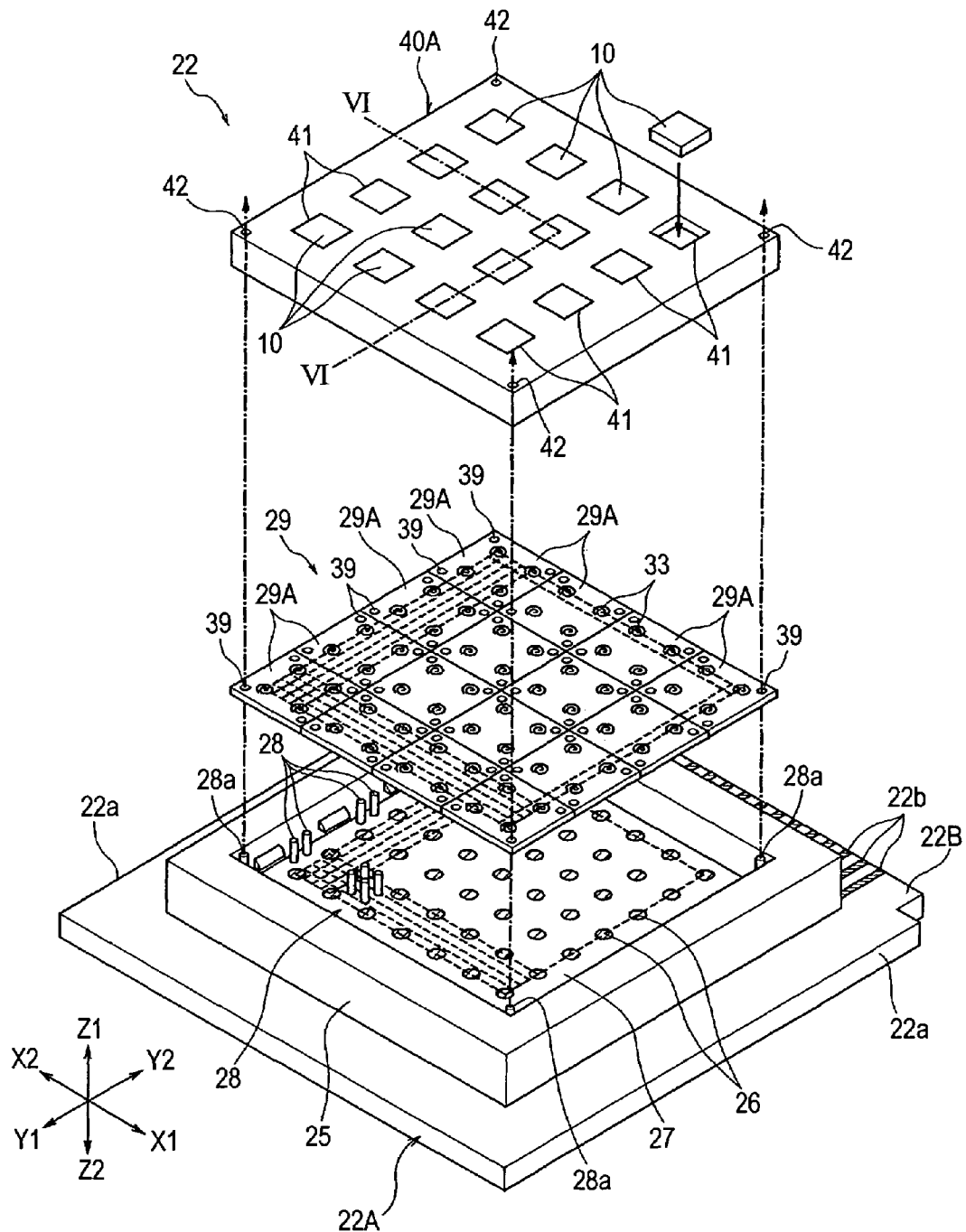
FIG. 2 is an exploded perspective view showing a first embodiment of a burn-in board and semiconductor carrier tray incorporated into the burn-in tester.
Figure 3:
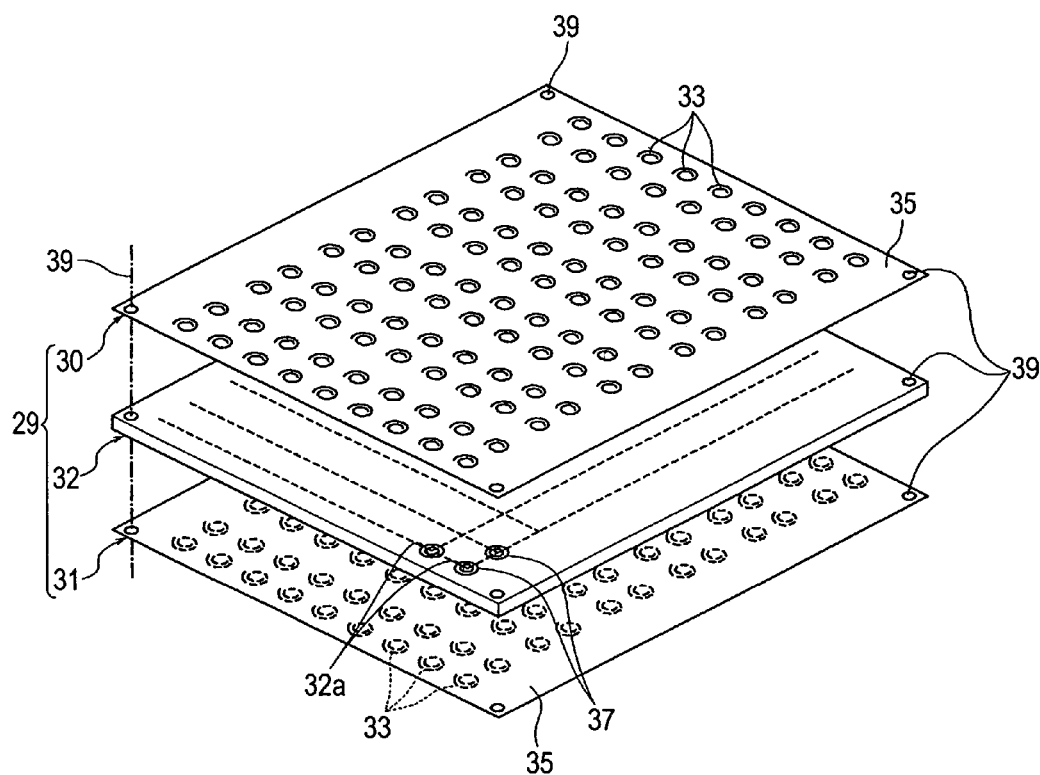
FIG. 3 is an exploded perspective view showing a relay substrate incorporated into the burn-in board.
Figure 4:
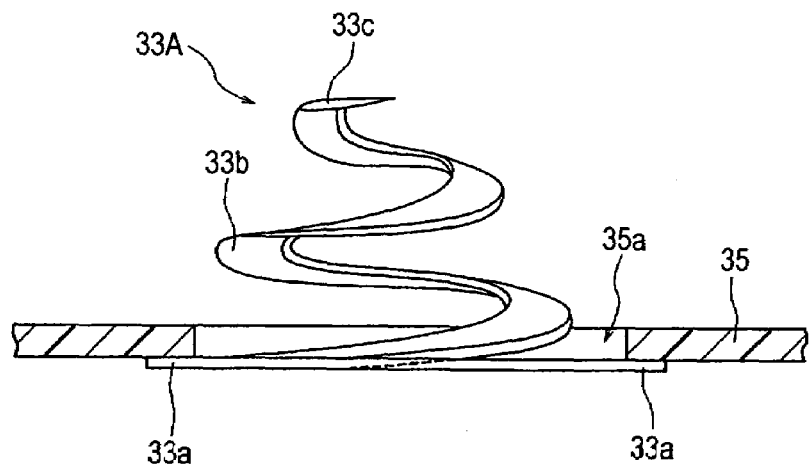
FIG. 4 is an enlarged side view showing the overall structure of a spiral contactor as an embodiment of an elastic contact.
Figure 5:
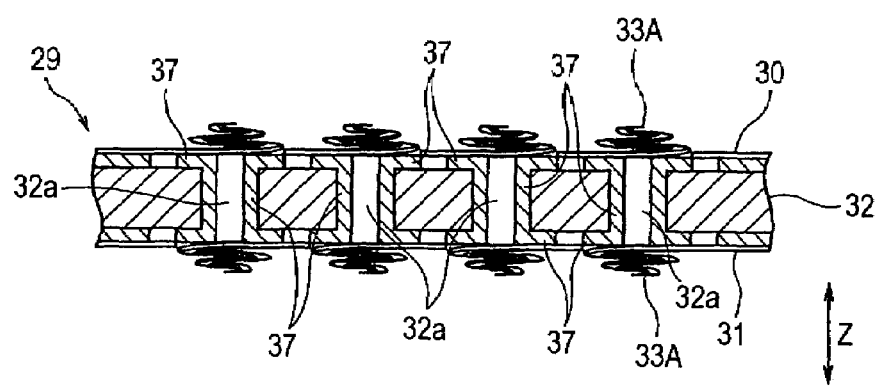
FIG. 5 is a partial sectional view of the relay substrate shown in FIG. 3.
Figure 6:
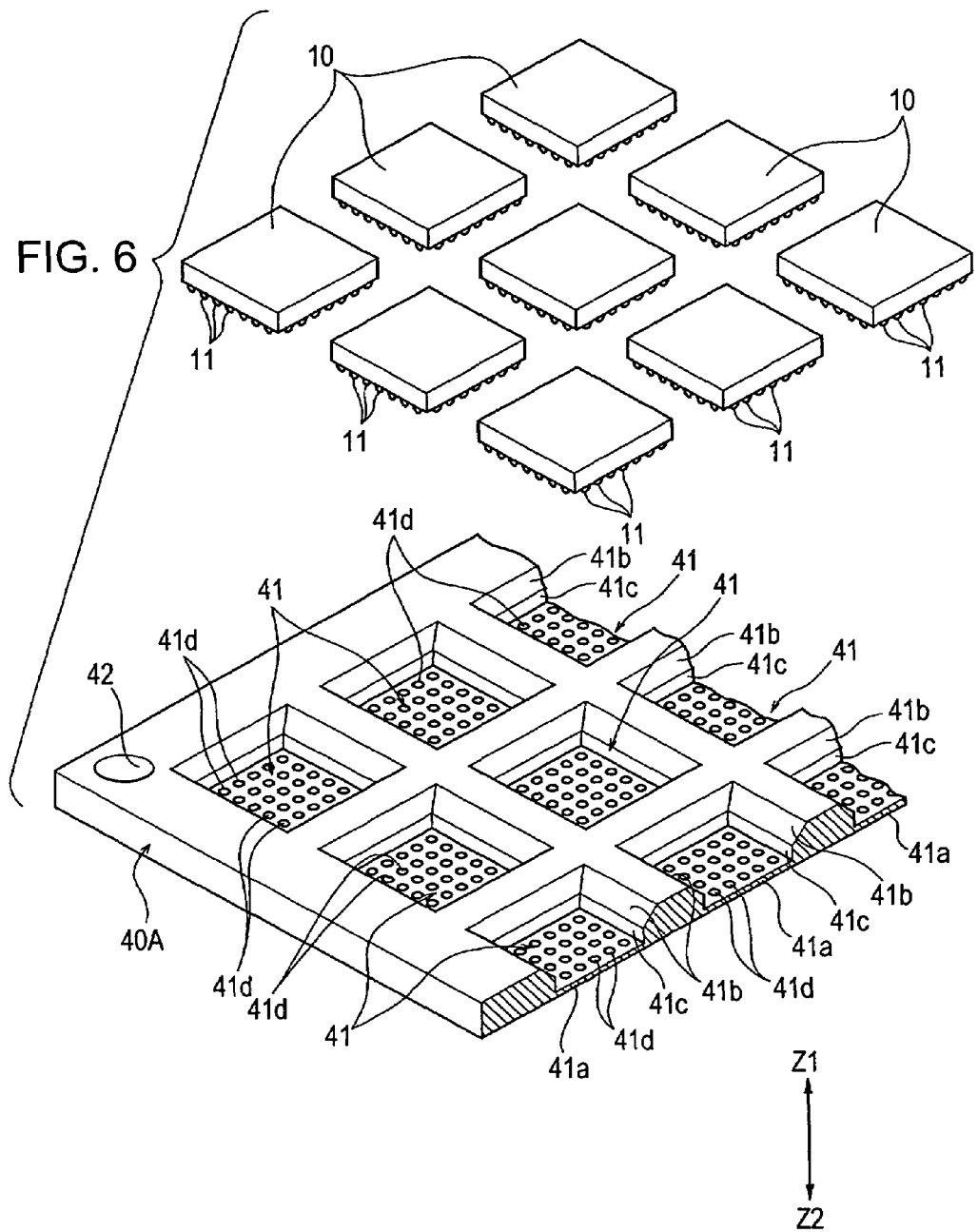
FIG. 6 is a partial perspective view of a semiconductor carrier tray taken along the line a-b-c of FIG. 2.
Figure 7:
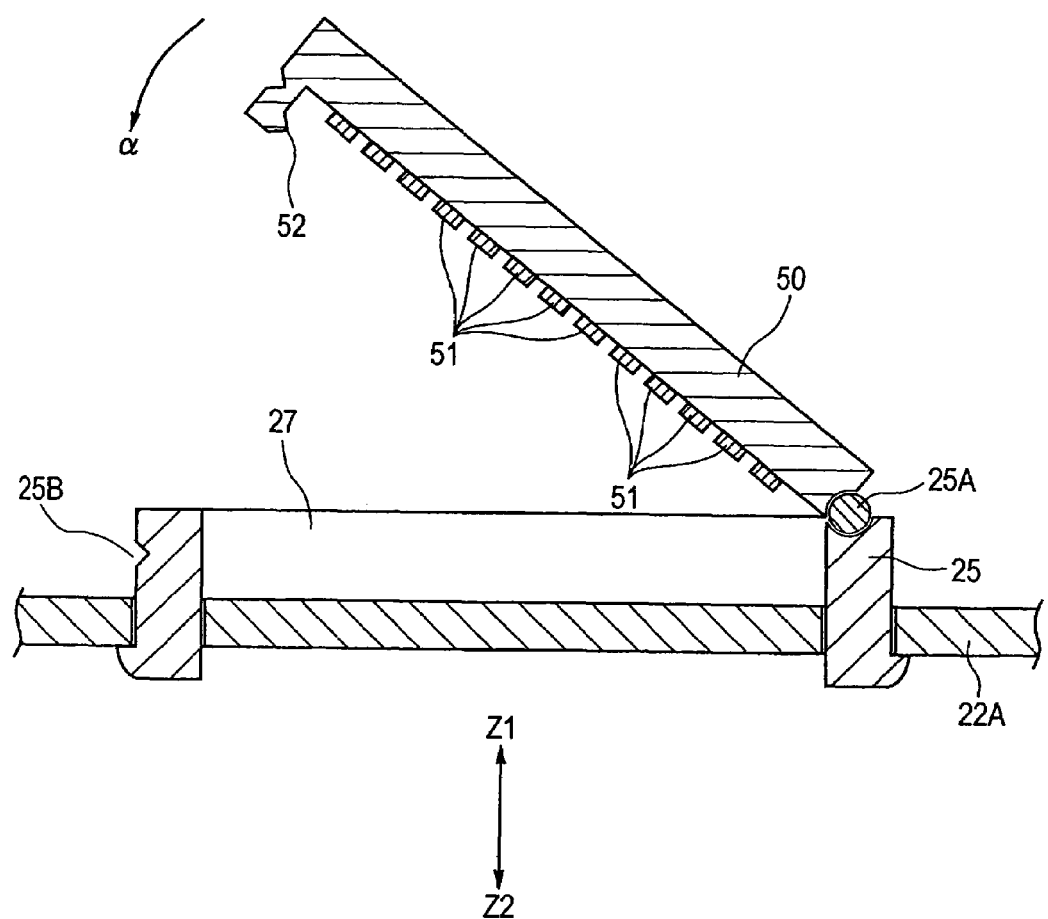
FIG. 7 is a sectional view showing an example of a holding mechanism (tray holder) composed of a housing and a lid member constituting the burn-in board.
Figure 8A:
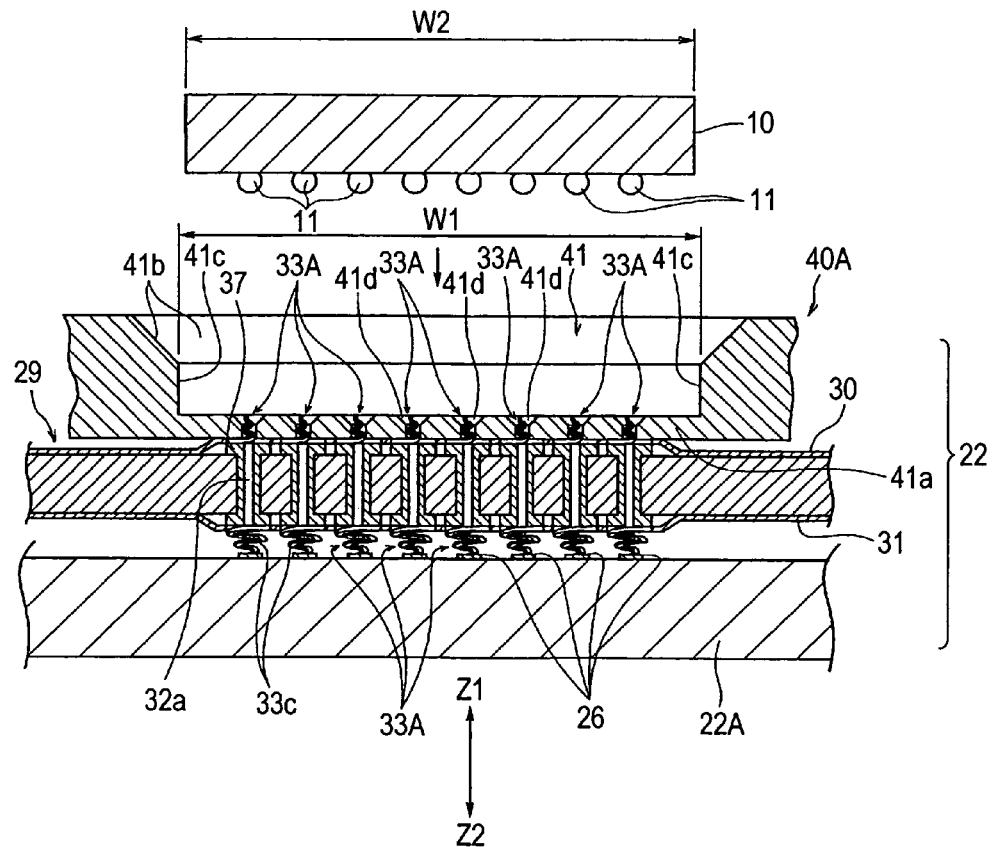
FIG. 8A is a partial sectional view of the burn-in board showing a state prior to accommodating semiconductors.
Figure 8B:
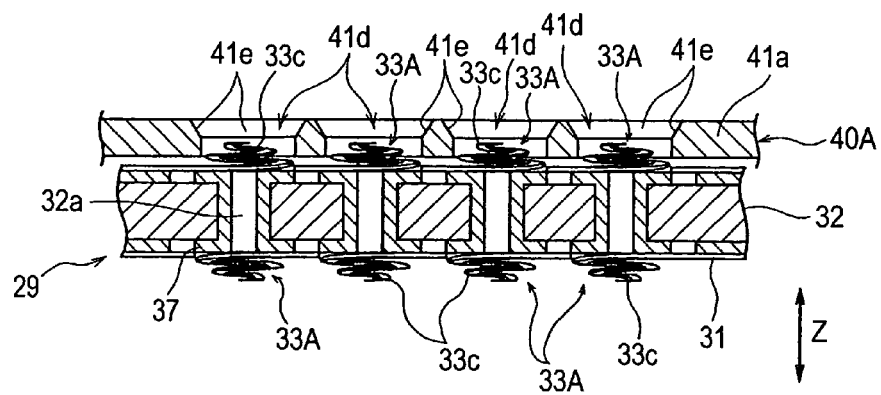
FIG. 8B is a partially enlarged sectional view of FIG. 8A.
Figure 9:
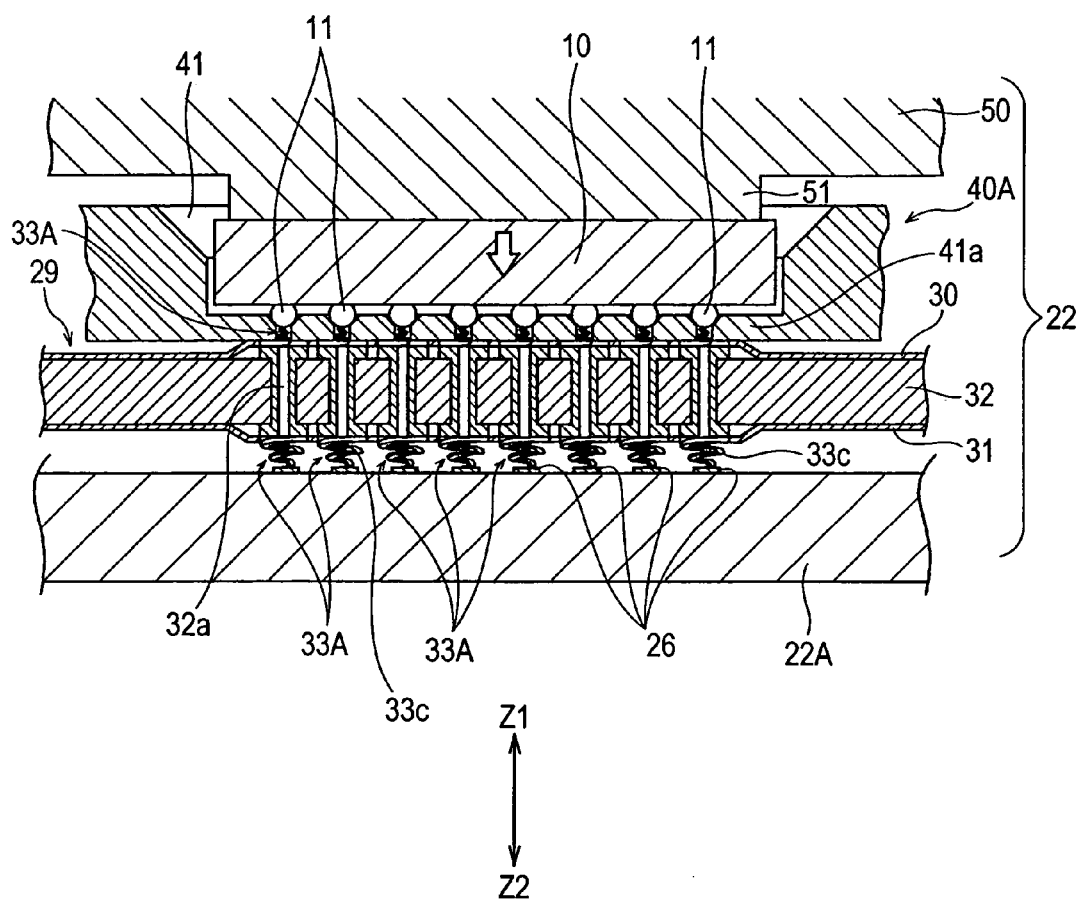
FIG. 9 is a partial sectional view of the burn-in board showing a state after accommodating the semiconductors.

FIG. 1 is a perspective view of a burn-in tester, FIG. 2 is an exploded perspective view showing a first embodiment of a burn-in board and semiconductor carrier tray incorporated into the burn-in tester, FIG. 3 is an exploded perspective view showing a relay substrate incorporated into the burn-in board, FIG. 4 is an enlarged side view showing the overall structure of a spiral contactor as an embodiment of an elastic contact, FIG. 5 is a partial sectional view of the relay substrate shown in FIG. 3, FIG. 6 is a partial perspective view of a semiconductor carrier tray taken along the line a-b-c of FIG. 2, FIG. 7 is a sectional view showing an example of a holding mechanism (tray holder) composed of a housing and a lid member constituting the burn-in board, FIG. 8A is a partial sectional view of the burn-in board showing a state prior to accommodating semiconductors, FIG. 8B is a partially enlarged sectional view of FIG. 8A, and FIG. 9 is a partial sectional view of the burn-in board showing a state after accommodating the semiconductors.

A burn-in tester 20 shown in FIG. 1 has a door 21 provided in its front surface. A heating furnace 20A is provided behind the door 21, and a large number of burn-in boards shown in FIG. 2 are accommodated in the heating furnace 20A in a stacked state. An operation portion 23 having various kinds of measuring instrument such as a thermometer and a timer and various buttons is provided in the front surface of the burn-in tester 20.

It should be noted that a plurality of guide grooves 20a arranged in pairs and extending in the depth direction (Y2 direction) are formed in the vertical (Z) direction at predetermined intervals in both right and left side surfaces with respect to the X direction in the heating furnace 20A of the burn-in tester 20. Thus, both side portions 22a of each burn-in board 22 can be inserted into the guide grooves 20a.

The burn-in board 22 mounted inside the burn-in tester 20 can be pulled out toward the front as shown in FIG. 1, and a large number of semiconductors 10 such as IC packages can be retained on the burn-in board 22 thus pulled out. Each semiconductor 10 is composed of, for example, a CPU, a type of memory, an image pickup element such as a CCD or a CMOS image sensor, or a printer thermal head. Further, each semiconductor 10 is assembled into a package with at least one bare chip (electronic function element) cut out from a wafer being mounted thereon. The semiconductor 10 has in the bottom surface thereof projecting contact electrodes 11 for connection to contactors that are externally provided (see FIG. 6 or the like). It should be noted that while the description below will be directed to the case where the semiconductor 10 is a CPU, the same description applies to other types of semiconductor.

The burn-in board 22 has a base substrate 22A formed of, for example, a printed-wiring board (PWB) having a multiple-layer structure. As shown in FIG. 2, a large number of contact electrodes 26 dotted in a matrix arrangement are formed on the surface of the base substrate 22A. Further, an insertion projection 22B is formed on the rear side (Y2 side) of the base substrate 22A, and a plurality of connection electrodes 22b extending in the Y direction in the drawing are formed by patterning on both the front and back surfaces of the insertion projection 22B. The connection electrodes 22b and the contact electrodes 26 are connected to each other by means of the wiring patterns formed on both the front and back surfaces of the base substrate 22A.

It should be noted that a socket (not shown) for sandwiching the insertion projection 22B of the base substrate 22A from above and below is provided to the rear surface of the burn-in tester 20 (the Y2-side inner wall in the heating furnace 20A). When both the side portions 22a of the base substrate 22A are inserted into the guide grooves 20a and pushed to the rear portion, and the insertion projection 22B is fitted into (slotted-in) the socket, a sandwiching electrode (not shown) provided in the socket and the connection electrode 22b of the base substrate 22A can be electrically connected to each other. Thus, an electrical signal can be sent to and received from the contact electrode 26 from outside via the sandwiching electrode of the socket and the connection electrode 22b.

As shown in FIG. 2, a housing 25 serving as a holding mechanism (tray holder), a relay substrate 29, a semiconductor carrier tray 40A, and the like are provided on the base substrate 22A.

The housing 25 is a frame-like member with no top surface (Z1-side surface) and bottom surface (Z2-side surface), and the inner portion of the housing 25 serves as an accommodating portion 27. The housing 25 is fixed to a predetermined portion on the base substrate 22A in an accurately positioned manner.

The relay substrate 29 is provided inside the accommodating portion 27. As shown in FIG. 3, the relay substrate 29 is composed of an upper contact sheet 30, a lower contact sheet 31, and a base 32 provided therebetween. The upper contact sheet 30 is composed of a large number of elastic contacts 33 and a resin sheet 35 for fixedly retaining the elastic contacts 33. Likewise, the lower contact sheet 31 is also composed of a large number of elastic contacts 33 and a resin sheet 35 for fixedly retaining the elastic contacts 33.

Spiral contactors 33A such as those shown in FIG. 4 may be used as the elastic contacts 33. The spiral contactor 33A according to this embodiment has a base portion 33a provided on the outer peripheral side, and an elastic deformation portion 33b extending in a spiral fashion from the base portion 33a toward the center. The distal end (distal end portion 33c) of the elastic deformation portion 33b is formed in a three dimensional configuration which projects in a projecting or chevron configuration as it extends toward the center of the spiral. The resin sheet 35 is formed of an insulating resin film, for example, polyimide, and a number of through-holes 35a dotted in a matrix are formed in the resin sheet 35. The upper surface of the base portion 33a of each spiral contactor 33A is fixed to one surface side of the resin sheet 35 at a position corresponding to the edge portion of the through-hole 35a, and the elastic deformation portion 33b and the distal end portion 33c are made to project through the through-hole 35a onto the other surface.

As shown in FIG. 5, the base 32 has through-holes 32a formed at positions opposed to the spiral contactors 33A, which are located above and below the base 32, with respect to the film thickness direction (the Z direction in the drawing). Conducting layers 37 are formed by sputtering or the like in the periphery of the through-holes 32a. The conducting layers 37 are formed so as to extend to a part of the upper surface and to a part of the lower surface of the base 32. It should be noted that adjacent conducting layers 37 are not in electrical continuity with each other.

As shown in FIG. 5, the upper contact sheet 30 is bonded onto the upper surface side of the base 32 with a conductive adhesive or the like. Likewise, the lower contact sheet 31 is bonded onto the lower surface side of the base 32 with a conductive adhesive or the like. As shown in FIG. 5, as for one spiral contactor 33A and the other spiral contactor 33A of each pair of spiral contactors vertically opposed to each other through the base 32, the base portion 33a of each spiral contactor 33A and the conducting layer 37 formed in the base 32 are connected to each other for electrical continuity through a conductive adhesive or the like.

As shown in FIG. 2, at the four corners of the relay substrate 29, there are provided insertion holes 39 allowing insertion of positioning pins 28 provided upright on the inner side of the housing 25. The relay substrate 29 is accommodated in the accommodating portion 27 of the housing 25 in a positioned state by inserting the positioning pins 28 into the corresponding insertion holes 39.

As shown in FIG. 2, the relay substrate 29 may consist of a single large relay substrate 29 that is accommodated in the housing 25 as it is or may consist of segmented small relay substrates 29A that can be accommodated in the housing 25 on a per-block basis, the plurality of small relay substrates 29A being combined together to form one large relay substrate 29. In the following description, unless otherwise stated, the relay substrate 29 is regarded as including the small relay substrates 29A.

It should be noted that in this state, a distal end portion 33c of the spiral contactor 33A provided in the lower contact sheet 31 of the relay substrate 29 abuts the contact electrode 26 formed and exposed on the surface of the base substrate 22A, thus bringing the spiral contactor 33A and the contact electrode 26 into conductive contact with each other (see FIGS. 8A and 9).

Further, when the semiconductor 10 is pressed on in the Z2 direction in the drawing by closing a lid portion 50 that will be described later, a plurality of projecting contact electrodes 11 composed of conical contactors (CGA), spherical contactors (BGA), or the like provided on the bottom surface of the semiconductor 10 can be elastically pressed against the spiral contactors 33A provided on the upper contact sheet 30 of the relay substrate 29. At the same time, the spiral contactors 33A provided on the lower contact sheet 31 of the relay substrate 29 and the contact electrodes 26 of the base substrate 22A can be elastically pressed against each other. This makes it possible to prevent a problem such as a contact failure between the terminals.

It should be noted that the load per each spiral contactor 33A is equal to or less than 0.098 N (100 gf), which is comparatively smaller than that of the prior art. Accordingly, even when the force with which the lid member 50 holds down the semiconductor 10 is reduced, it is possible to secure the continuity between the individual spiral contactors 33A and the individual projecting contact electrodes 11.

Further, the relay substrate 29 can move vertically within the accommodating portion 27 along the positioning pins 28, thus enabling mounting and demounting of the relay substrate 29 within the accommodating portion 27. Thus, the relay substrate 29 can be readily replaced as required.

It should be noted that in the case where the large relay substrate 29 is employed, when there is a defect in a part thereof, the entire large relay substrate 29 must be replaced even through a large portion thereof remains non-defective. In contrast, in the case where the small relay substrates 29A are employed, even when a defect occurs in some of the relay substrates 29A, it is possible to replace only the defective small relay substrates 29A on the per-block basis, which makes it possible to prevent wastage as compared with the case of using the large relay substrate 29 and also proves advantageous in reducing the cost required for maintenance.

It should be noted that with regard to the expression "on the per-block basis" above, a portion corresponding to a single semiconductor 10 may be regarded as one block, or a cluster of semiconductors 10 arranged in a 2×2 or 3×3 matrix form, for example, may serve as one block.

Next, a semiconductor carrier tray according to the present invention will be described.

As shown in FIG. 2, the semiconductor carrier tray 40A according to the first embodiment is provided above the relay substrate 29 in the accommodating portion 27.

The semiconductor carrier tray 40A is formed of a resin that does not deform easily due to heat, metal, or the like. A number of receiving portions 41 having a recessed sectional configuration are aligned in a planar matrix form on the surface of the semiconductor carrier tray 40.

As shown in FIG. 6 and the like, the four sides of each receiving portion 41 are surrounded by an inclined surface 41b gradually narrowing in the direction (Z2 direction in the drawing) of a bottom surface (semiconductor retaining portion) 41a of the receiving portion 41 as it extends from a surface of the semiconductor carrier tray 40A, and a side surface 41c extending vertically downwards in the direction of the bottom surface (semiconductor retaining portion) 41a of the receiving portion from a position midway through the inclined surface 41b. Further, in the bottom surface (semiconductor retaining portion) 41a of the receiving portion, a plurality of retention holes 41d, which extend through the bottom surface 41b in the Z direction in the drawing, are formed in a matrix arrangement at positions corresponding to all of the projecting contact electrodes 11 provided on the bottom surface of the semiconductor 10.

As shown in FIG. 8B, on the upper end side located above each individual retention hole 41b in the drawing, there is formed an inclined surface 41e that gradually diverges upwards in the drawing from about the middle of the thickness of the retention hole 41d. As shown in FIGS. 8A and 8B, the spiral contactors (elastic contacts) 33A provided on the surface of the relay substrate 29 are arranged at positions opposed to and below the bottom surface (semiconductor retaining portion) 41a of the receiving portion provided with the plurality of retention holes 41d. The individual spiral contactors 33A provided on the upper and lower sides of the relay substrate 29, and the contact electrodes 26 of the burn-in board 22 are arranged in a high-density matrix so as to be opposed to the individual retention holes 41d formed in the bottom surface (semiconductor retaining portion) 41a of the receiving portion of the semiconductor carrier tray 40A.

As shown in FIG. 2, positioning holes 42 allowing insertion of the four positioning pins 28a provided at the four corners inside the housing 25 are formed at the four corners of the surface of the semiconductor carrier tray 40A. Accordingly, upon mounting the semiconductor carrier tray 40A in place inside the housing 25, the positioning pins 28a are respectively inserted into the positioning holes 42, thereby enabling accurate positioning of the semiconductor carrier tray 40A in the accommodating portion 27 of the housing 25. In this regard, the positioning holes 42 and the positioning pins 28a form a positioning mechanism for positioning the semiconductor carrier tray 40A in the accommodating portion 27 of the housing 25.

It should be noted that during the burn-in test, the semiconductor carrier tray 40A is preferably fixed in place within the accommodating portion 27 of the housing 25 on the base substrate 22A. The fixation at this time can be accomplished by, for example, forming a female thread portion at the distal end of the positioning pins 28a, and after inserting the positioning holes 42 onto the positioning pins 28a, attaching and fastening a screwing member such as a nut to the distal end of the female thread portion.

As shown in FIGS. 8A and 9, the dimension W1 between the opposite side surfaces 41c of the receiving portion 41 of the semiconductor carrier tray 40A is formed larger than the width dimension W2 of the semiconductor 10. The semiconductor 10 can be thus mounted in between both the side surfaces 41c (inside the receiving portion 41). It should be noted, however, that since the width dimension W2 of each individual semiconductor 10 is subject to large errors, even when the semiconductor 10 is mounted in the receiving portion 41 with the side surface 41c taken as the reference surface, it is difficult to accurately position the semiconductor 10 in the receiving portion 41.

In view of this, according to the present invention, as shown in FIG. 9, the positioning of the semiconductor 10 in the receiving portion 41 can be carried out by using the projecting contact electrodes 11 of the semiconductor 10 and the individual retention holes 41d formed in the bottom surface (semiconductor retaining portion) 41a of the receiving portion. That is, the retention hole 41d functions as an electrode retaining portion for accurately positioning the projecting contact electrode 11 of the semiconductor 10 in an appropriate position inside the receiving portion 41.

Further, upon mounting the semiconductor 10 to the receiving portion 41 of the semiconductor carrier tray 40A, all the projecting contact electrodes 11 formed on the bottom surface of the semiconductor 10 can be fitted into the corresponding ones of the plurality of retention holes 41d formed in the bottom surface (semiconductor retaining portion) 41a of the receiving portion, thereby enabling high-accuracy positioning of the individual semiconductors 10 in the individual receiving portions 41 with the projecting contact electrodes 11 themselves serving as the reference.

Further, in the arrangement shown in FIG. 7, for example, the housing 25 is provided with a hinge portion 25A, with the lid member 50 being pivotally supported through the hinge portion 25A. A number of pressing portions 51 extending in the Z2 direction in the drawing are arranged in a matrix on the lower surface of the lid member 50 so as to be opposed to the receiving portion 41. It should be noted, however, that the pressing portions 51 are not always necessary. That is, in the case where the upper surface of the semiconductor 10 immediately after its mounting in the receiving portion 41 is positioned higher than the surface (upper end portion) of the semiconductor carrier tray, upon closing the lid member 50, the lower surface of the lid member 50 can directly press on the upper surface of the semiconductor 10; accordingly, in this case, there is no particular problem in omitting the pressing portions 51.

The construction of the housing 25 in the above case is preferably such that, as shown in FIG. 7, a locking recess 25B is provided in the outer side surface of the housing 25 and at a position opposite to the hinge portion 25A, with a latching protrusion 52 being provided at a position on the lid member 50 side corresponding to the locking recess 25B. The locking recess 25A and the lathing protrusion 52 constitute locking means. Further, upon pivoting the lid member 50 in the direction α in FIG. 7 about the hinge portion 25A, the locking recess 25B and the latching protrusion 52 are brought into locking engagement with each other, whereby the lid member 50 is fixed onto the upper portion of the housing 25. At this time, the accommodating portion 27 of the housing 25 is covered by the lid member 50.

Next, a second embodiment of a burn-in board and semiconductor carrier tray will be described.

Figure 10A:
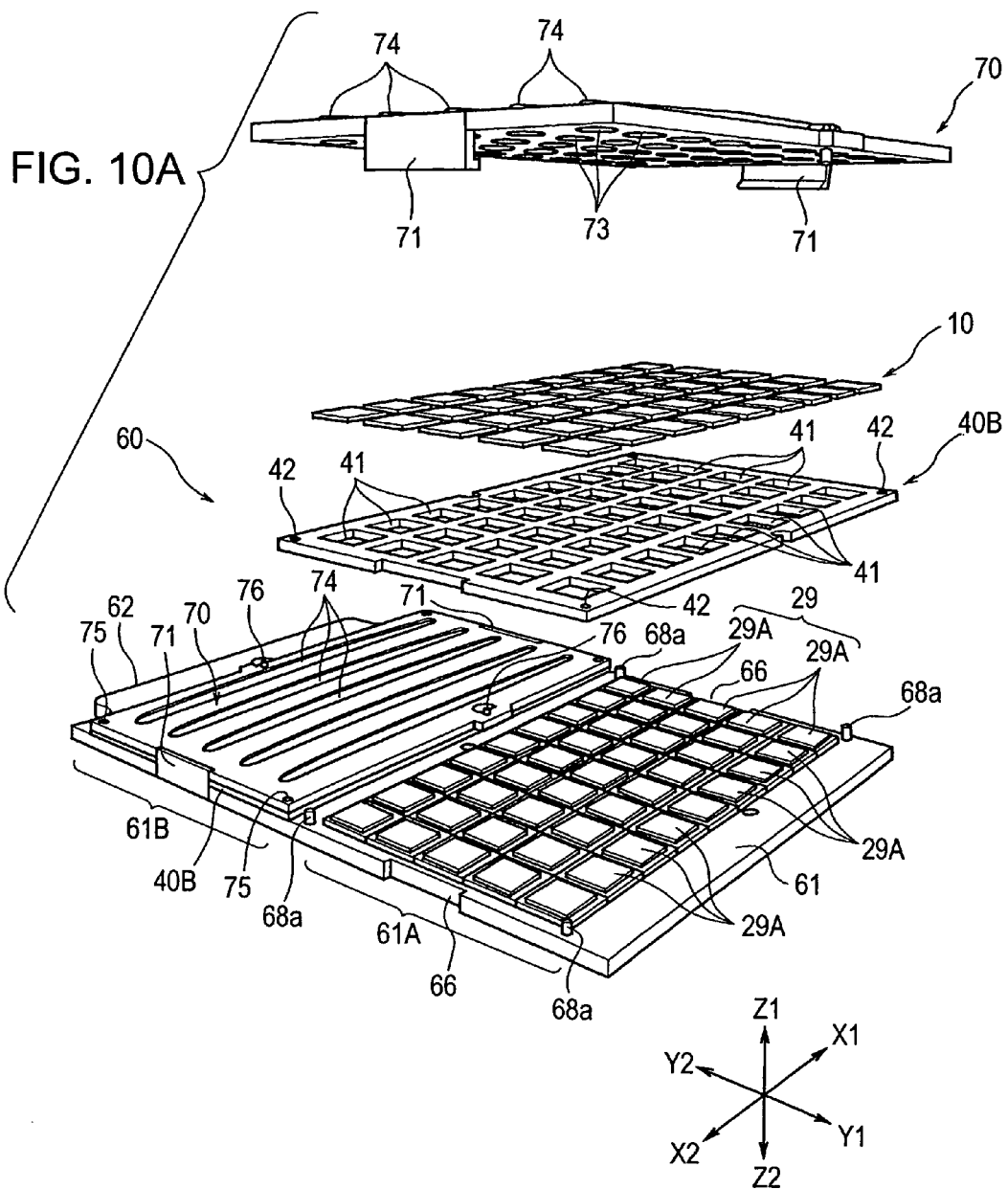
FIG. 10A is a perspective view showing the second embodiment of a burn-in board and semiconductor carrier tray incorporated into the burn-in tester.
Figure 10B:
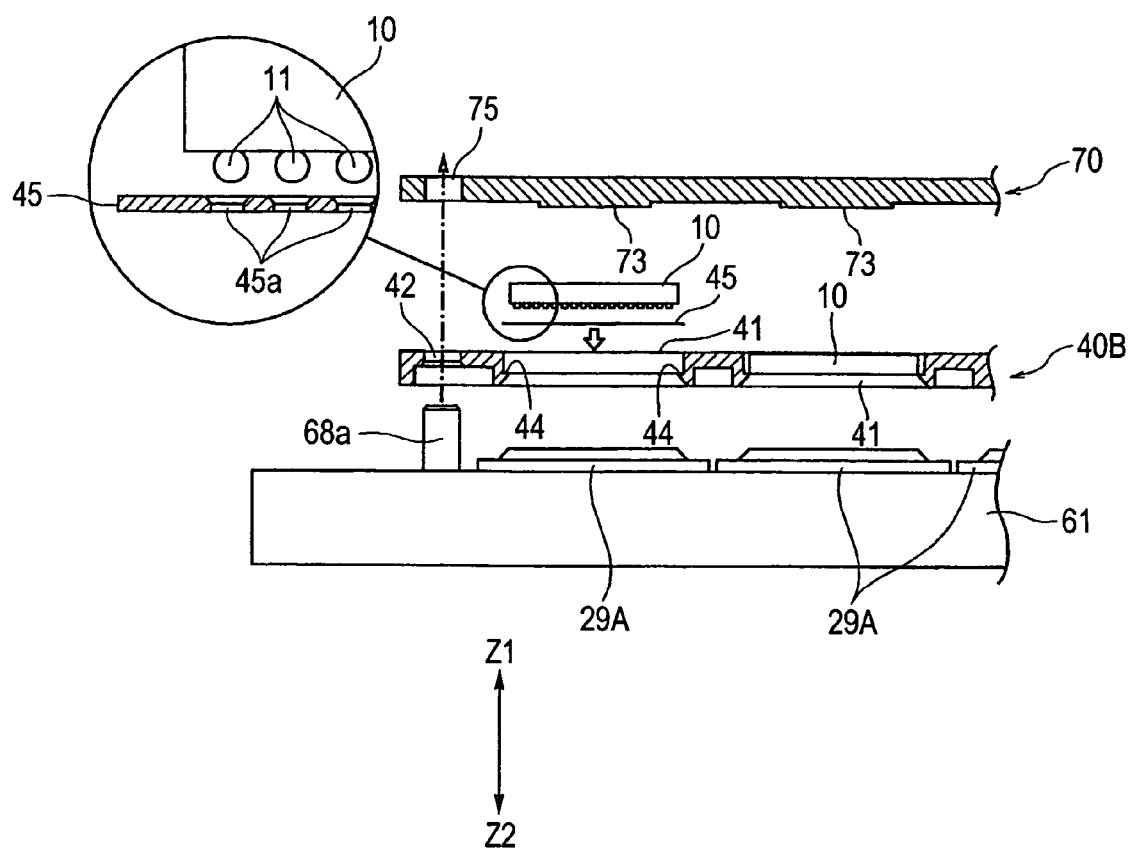
FIG. 10B is a partial sectional view of the burn-in board shown in FIG. 10A.

FIG. 10A is a perspective view showing the second embodiment of a burn-in board and semiconductor carrier tray incorporated into the burn-in tester, and FIG. 10B is a partial sectional view of the burn-in board shown in FIG. 10A. It should be noted that the burn-in board according to the second embodiment is of a type in which two sets of semiconductor carrier tray and lid member are mounted onto one base substrate so as to be longitudinally side-by-side to each other.

A burn-in board 60 according to the second embodiment shown in FIGS. 10A and 10B has a base substrate 61 provided in the lowermost portion thereof with respect to the Z2 direction in the drawing, with the relay substrate 29 of a large size, two semiconductor carrier trays 40B according to the second embodiment, the plurality of semiconductors 10, and two lid members 70 being provided in the stated order above the base substrate 61. That is, a major difference of the construction according to the second embodiment from the construction according to the first embodiment resides in that no housing is provided in the second embodiment, and that the lid member 70 is not pivotally provided but provided independently as a separate component.

As shown in FIGS. 10A and 10B, the base substrate 61 according to this embodiment is split into two regions consisting of a first region 61A on the Y1 side in the drawing, and a second region 61B on the Y2 side in the drawing. It should be noted that in FIG. 10A, the first region 61A side shows the disassembled state of respective members, and the second region 61B side shows the stacked state of the respective members. Further, although not shown in FIGS. 10A and 10B, a large number of contact electrodes are dotted in a matrix across the surfaces of the first region 61A and of the second region 61B similarly to the base substrate 22A.

As in the first embodiment described above, on the Y2-side in the drawing of the base substrate 61, there is provided an insertion projection 62 to be fitted in (slotted in) to the socket provided inside the burn-in tester 20. Further, positioning pins 68a extending in the Z2 direction in the drawing are provided upright at the four corners in each of the first region 61A and second region 61B of the base substrate 61.

The relay substrate 29 and the semiconductor carrier tray 40 are constructed in the same manner as described in the first embodiment. That is, the plurality of small relay substrates 29A are arranged in a matrix on the per-block basis on the first region 61A and the second region 61B, thereby forming the large relay substrate 29. The positioning holes 42 are provided at the four corners of the semiconductor carrier tray 40B, and the positioning pins 68a are respectively into the positioning holes 42. Accordingly, the two semiconductor trays 40B are respectively provided to the first region 61A and the second region 61B on the base substrate 61 in a positioned state.

As shown in FIG. 10B, in the second embodiment as well, the semiconductors 10 are held in the respective receiving portions 41 formed in the semiconductor carrier tray 40B. It should be noted, however, that in the second embodiment a stepped portion 44 is circumferentially provided at the middle in the thickness direction inside the receiving portion 41 provided in the semiconductor carrier tray 40B, and a guide plate 45 serving as the bottom surface 41a of the receiving portion 41, that is, as the semiconductor retaining portion, is provided in a positioned state to the stepped portion 44. A plurality of retention holes 45a are formed in a matrix arrangement in the guide plate 45.

The construction and role of the plurality of retention holes 45a formed in the guide plate (semiconductor retaining portion) 45 are the same as those of the plurality of retention holes 41d formed in the bottom surface 41a of the receiving portion 41 according to the first embodiment, that is, the retention holes 45a function as the electrode retaining portions. Specifically, the projecting contact electrodes 11 formed on the bottom surface of the semiconductor 10 are brought into fitting engagement with the upper ends of the retention holes 45a, and the distal end portions of the elastic contacts 33 formed on the relay substrate 29 are inserted in the lower ends of the retention holes 45a, thus ensuring that the elastic contacts 33 and the projecting contact electrodes 11 elastically contact (elastically press against) each other inside the retention holes 45a.

Each single burn-in board 60 is provided with the lid members 70 respectively corresponding to the first and second regions 61A and 61B. Lock arms 71 extending in the Z2 direction in the drawing and having a substantially L-shaped configuration are provided at the opposite ends in the longitudinal direction (X direction) of the lid member 70, and the lock arms 71 can be latched onto lock receiving portions 66 provided at the opposite ends in the lateral direction (X direction) of the base substrate 61.

Further, a plurality of projecting ribs 74, which extend along the direction (X direction) perpendicularly crossing the longitudinal direction (Y direction) of the base substrate 61, are integrally formed on the upper surface of the lid member 70 at a predetermined spacing in the longitudinal direction (Y direction) of the burn-in board 60.

In general, when the base substrate 61 as descried above is heated as it is, the base substrate 61 undergoes longitudinal distortion, which is liable to result in longitudinal warpage, that is, warpage that causes the opposite end portions (the opposite end portions in the X1 and X2 directions) of the base substrate 61 to be lifted up (or down) with respect to the central portion in the lateral (X) direction of the base substrate 61.

According to the present invention, however, since the longitudinal direction (X direction) of the lid member 70 perpendicularly crosses the longitudinal direction (Y direction) of the base substrate 61, when a force causing the burn-in board 61 to warp in the lateral (X) direction is exerted, the lid member 71 serves to suppress this force, thereby making the base substrate 61 less susceptible to the above-described warpage. Furthermore, the plurality of projecting ribs 74 extending in the longitudinal direction (X direction) of the lid member 70 are arranged at a predetermined spacing on the surface of the lid member 70, and the projecting ribs 74 serve as reinforcing members for suppressing deformation of the lid member 70 itself, thereby further preventing the above-described warpage of the base substrate 61.

It should be noted that arranging the projecting ribs 74 in a matrix on the surface of the lid member 70 is preferable in suppressing not only the warpage of the base substrate 61 in the lateral direction (X direction) but also warpage in the longitudinal direction (Y direction).

It should be noted that in this embodiment as well, a large number of pressing portions 73 extending in the Z2 direction in the drawing are arranged in a matrix on the lower surface of the lid member 70 so as to be opposed to the receiving portions 41. However, as described above, the pressing portions 51 are not always necessary. Further, positioning holes 75 are formed at the four corners of the lid member 70. With the respective positioning pins 68a provided upright on the base substrate 61 being inserted into the positioning holes 75, the lid member 70 is placed on the first region 61A and the second region 61B in a positioned state.

Further, the fixation of the lid member 70 onto the first region 61A and the second region 61B on the base substrate 61 can be carried out by using, for example, a quick fastener 76 or the like.

Next, a third embodiment of a semiconductor carrier tray will be described.

FIG. 11 is a partial perspective view, similar to FIG. 6, showing a semiconductor carrier tray according to the third embodiment. FIGS. 12A and 12B are enlarged sectional views of the portion of the semiconductor carrier tray according to the third embodiment, of which FIG. 12A shows a state prior to the loading of semiconductors, and FIG. 12B shows a state after the loading of the semiconductors.

The most remarkable structural difference of a semiconductor carrier tray 40C according to the third embodiment shown in FIG. 11 from the semiconductor tray 40B (see FIG. 6) according to the first embodiment and the semiconductor tray 40A (see FIG. 10B) according to the second embodiment resides in the formation of an opening 46 extending through the board thickness (Z) direction at the portion corresponding to the bottom surface 41a of the receiving portion 41. Otherwise, the third embodiment is of the same construction as the first and second embodiments.

At each of the four corners of the edge of the opening 46 of the semiconductor carrier tray 40C, there is provided a support member (semiconductor retaining portion) 47 that projects horizontally toward the center thereof. A retention hole 47a is bored at the center of the support member 44. The retention hole 47a is formed at a position corresponding to each of positioning projecting contact electrodes 11a formed at the corner portions, from among the large number of projecting contact electrodes 11 formed on the lower surface of the semiconductor 10.

The most preferred construction for achieving high-accuracy positioning of the semiconductor 10 is to form the retention holes 47a at the positions corresponding to the four corners of the edge of (at the four corners of) the opening 46 as described above. However, the formation positions for the retention holes 47a corresponding to the positioning projecting contact electrodes 11a are not limited to this; the retention holes 47a may be provided at three corner portions. Further, although slightly lower in terms of the positioning accuracy, a construction is also possible in which the retention holes 47a are provided in at least two corner portions. In this case, the retention holes 47a are preferably formed at diagonally opposite positions.

When, as shown in FIG. 12A, the semiconductor 10 is mounted into the receiving portion 41 of the semiconductor carrier tray 40C, as shown in FIG. 12B, the positioning projecting contact electrodes 11a provided at the corner portions are inserted into the retention holes 47a. At this time, the semiconductor 10 is supported by the support members (semiconductor retaining portions) 47 provided at the corner portions. Further, with the positioning projecting contact electrode 11a inserted into the retention hole 47a serving as the reference, the semiconductor 10 is accurately positioned inside the receiving portion 41.

On the other hand, the remaining large number of projecting contact electrodes 11 formed at positions other than the corner portions are placed inside the opening 46. As shown in FIGS. 12A and 12B, the relay substrate 29 is provided under the semiconductor carrier tray 40C. The spiral contactors 33A formed on the relay substrate 29 and serving as the plurality of elastic contacts 33 each have the shape of a three-dimensional projection and are capable of elastic deformation in the board thickness (Z) direction. Accordingly, when the lid member 50 or the lid member 70 is closed to effect locking, and the semiconductor 10 is pressed against the support member (semiconductor retaining portion) 47 of the receiving portion 41 as shown in FIG. 12B, the individual projecting contact electrodes 11 and the individual spiral contactors 33A can be brought into elastic contact with each other.

In this case well, the load per each spiral contactor 33A is small, so that even when the force with which the lid member holds down the semiconductor 10 is reduced, it is possible to reliably secure the continuity between the individual projecting contact electrodes 11 and the individual spiral contactors 33A.

With the semiconductor carrier tray 40C according to the third embodiment, it is not necessary to respectively insert all the elastic contacts 33 provided on the relay substrate 29 into the large number of retention holes 41d (or 45a) according to each of the first and second embodiments; it suffices to insert only the projecting contact electrodes 11a serving as the references into the retention holes 47a. The installation and the subsequent replacement of the relay substrate 29 can thus be performed easily and quickly.

Figure 13:
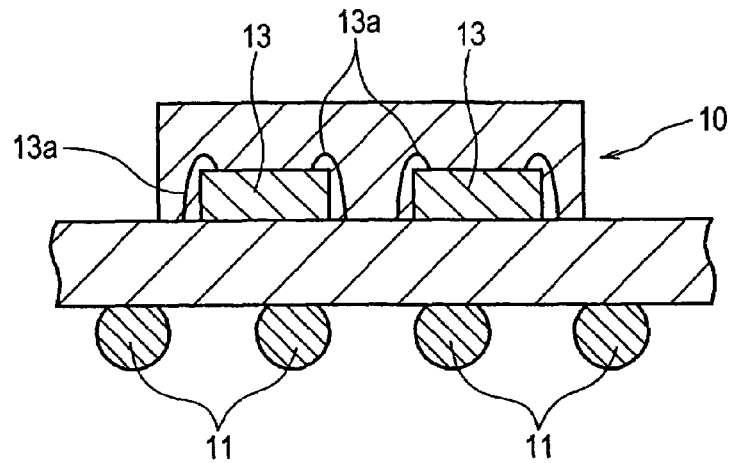
FIG. 13 is a partial enlarged sectional view of one semiconductor.
Figure 14:
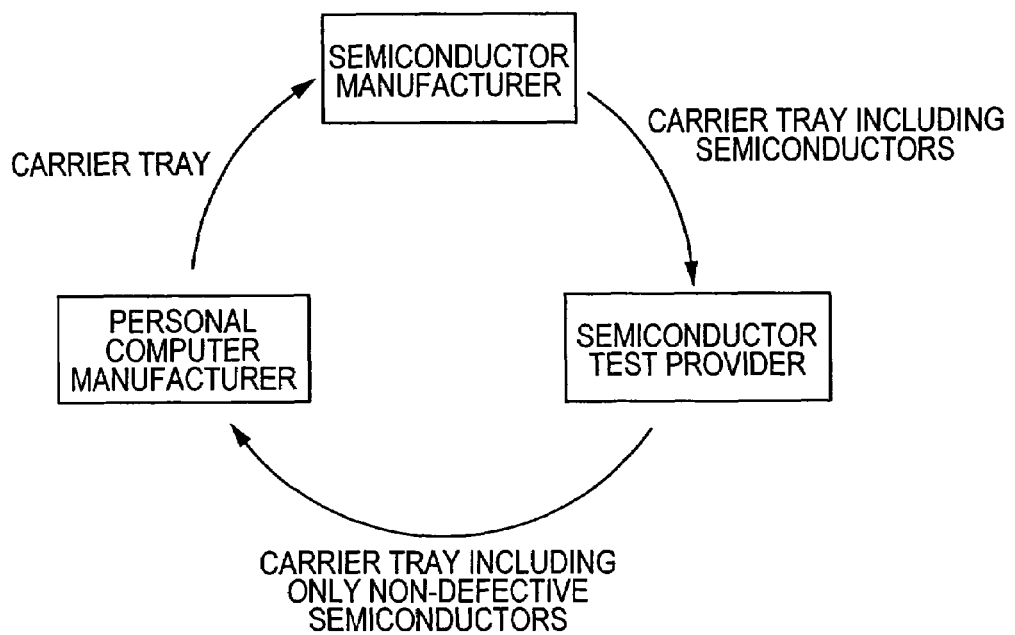
FIG. 14 is a diagram for explaining the cycle of reuse of the semiconductor carrier tray.
Figure 15:
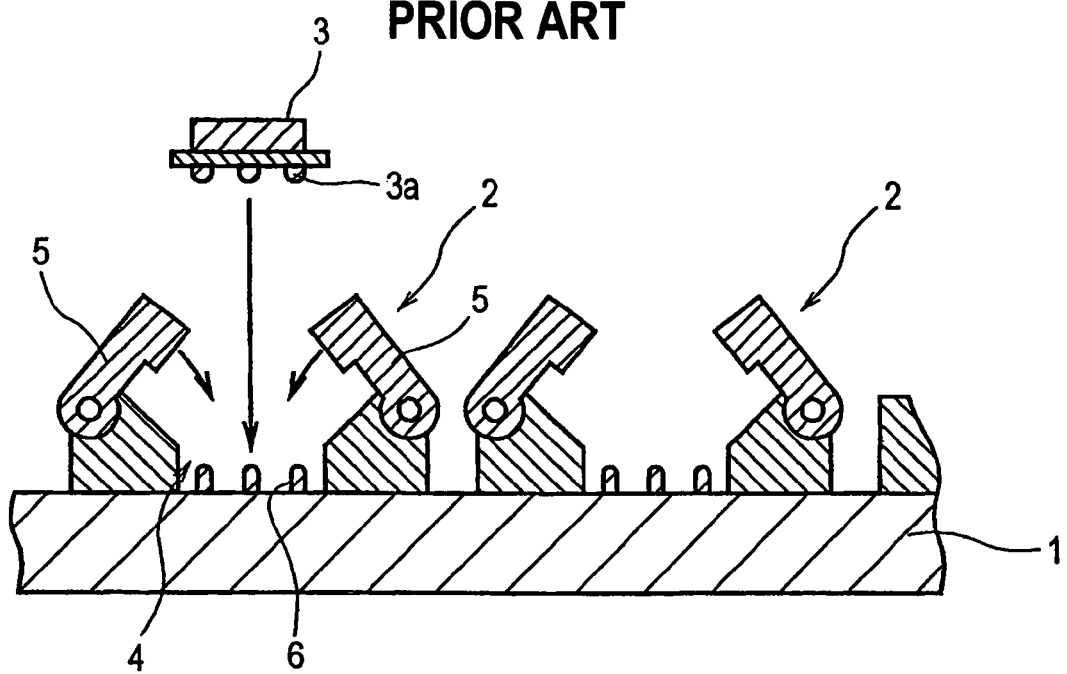
FIG. 15 is a partial sectional view of a conventional burn-in board.

Hereinbelow, a burn-in test and a semiconductor manufacturing method which use the semiconductor carrier tray and the burn-in tester will be described. It should be noted that while the description below will focus on the burn-in board 22 described in the first embodiment, the same description applies to the burn-in board 60 described in the second embodiment. The semiconductor carrier tray 40 to be used may be any one of the semiconductor carrier trays 40A, 40B, and 40C according to the first through third embodiments. FIG. 13 is a partial enlarged sectional view of one semiconductor, and FIG. 14 is a diagram for explaining the cycle of reuse of the semiconductor carrier tray.

First, the semiconductor carrier tray 40 having the large number of the semiconductors 10 loaded in the respective receiving portions 41 is mounted inside the accommodating portion 27 of the housing 25 in the burn-in board 22 (or on the burn-in board 61), and the lid member 50 is closed. At this time, the individual semiconductors 10 are pressed on by the respective pressing portions 51 provided to the lid member 50, whereby the large number of the projecting contact electrodes 11 of each semiconductor 10 and the large number of spiral contactors 33A provided on the upper side of the relay substrate 29 are elastically pressed against each other (see FIG. 9). At the same time, the large number of spiral contactors 33A provided on the lower side of the relay substrate 29 and the respective contact electrodes 26 formed on the surface of the base substrate 22A are elastically pressed against each other. The individual projecting contact electrodes 11 of the semiconductors 10 and the individual contact electrodes 26 are thus brought into electrical continuity with each other. Accordingly, by supplying an electrical signal from the external to each of the projecting contact electrodes 11 of the plurality of semiconductors 10 via the sandwiching electrode in the socket, the contact electrodes 22b of the base substrate 22A, the wiring patterns and the contact electrodes 26, and further the spiral contactors 33A on the upper and lower sides of the relay substrate 22A, thereby making it possible to collectively inspect the wiring states of the plurality of the semiconductors 10.

Next, as shown in FIG. 1, each burn-in board 22 is disposed inside the heating furnace 20A of the burn-in tester 20 to carry out a burn-in test.

Here, the burn-in test can be roughly divided into a so-called preliminary test (pre-burn-in test) and a main test (main burn-in test). The preliminary test is carried out by placing the semiconductors 10 under the temperature environment of about 90° C. for several seconds, and the main test is carried out by placing the same under a high temperature environment of, for example, about 125° C. to 150° C.

For instance, when a semiconductor 10 exhibiting an abnormal resistance value in part of its internal wiring is sent to the main test as it is without performing the preliminary test, the abnormality portion generates heat during the main test, which may, in the worst case, cause the burn-in board 22 to catch fire.

In view of this, with regard to those semiconductors 10 exhibiting an abnormality in the internal wiring thereof, the portion exhibiting the abnormal resistance value is completely burnt out during the main test, thereby preventing the burn-in board 22 from catching fire during the main test.

In the preliminary test, the semiconductor carrier tray 40 holding the large number of semiconductors 10 is placed inside the holding means (tray holder) composed of the housing 25 and the lid member 50 on the base substrate 22A (or between the burn-in board 60 and the lid member 70), whereby the preliminary test can be collectively carried out on the large number of semiconductors 10.

Next, in the main test, an electrical signal is supplied from the external to each semiconductor 10 on the burn-in board 22, thereby determining pass/failure of the semiconductor 10.

For example, as shown in FIG. 13, the semiconductors 10 are separated into semiconductors 10 which have become unusable due to a break in wiring 13a of bare chips 13 or the like, and non-defective semiconductors 10 that are usable with no such wiring breakage.

In this main test as well, the semiconductor carrier tray 40 holding the large number of semiconductors 10 is placed inside the holding means (tray holder) composed of the housing 25 and the lid member 50 on the base substrate 22A (or between the burn-in board 60 and the lid member 70), whereby the preliminary test can be carried out on the large number of semiconductors 10 at once.

It should be noted that in the case where the burn-in board used for the preliminary test and that used for the main test are of different kinds, the large number of semiconductors 10 can be collectively moved at once solely by transferring the semiconductor carrier tray 40 from the burn-in board for the preliminary test to the burn-in board for the main test, thereby achieving improved operation efficiency in this regard.

Conventionally, in order to set the plurality of semiconductors on the burn-in board, the burn-in board must be provided with an IC socket for each semiconductor 10, and due to the structural constraints imposed by the necessity of accommodating and holding the semiconductors 10, there is also a limit to the downsizing of the IC socket. That is, since the area to be occupied by one IC socket is large, and the number of semiconductors that can be placed on one burn-in board is small, it has been difficult to increase the number of semiconductors that can be subjected to a burn-in test at a time.

In contrast, according to the present invention, the entire carrier tray 40 in which the large number of semiconductors 10 are accommodated in advance is placed onto the base substrate 22A at once, thus making the IC socket for holding each individual semiconductor unnecessary, whereby the number of semiconductors 10 that can be placed on the burn-in board can be significantly increased.

Therefore, for each burn-in test, the burn-in test can be carried out on a substantially larger number of semiconductors 10 as compared with the prior art. This allows an increase in the efficiency of burn-in test.

Further, the loading of the semiconductors 10 to the semiconductor carrier tray 40 can be automatically carried out using, for example, a loader (not shown) in the manufacturing stage of the semiconductors 10 prior to the burn-in test. This operation is carried out by the manufacturer of the semiconductors 10.

Accordingly, in the burn-in test, there is no need to perform the operation of loading the large number of semiconductors one by one to the receiving portions 41 of the semiconductor carrier tray 40 on the burn-in board. Thus, test providers dedicated to carrying out only a burn-in test, in particular, can readily implement a burn-in test by simply purchasing the semiconductor tray 40 with the semiconductors 10 previously loaded into the receiving portions 41, from the semiconductor manufacturer.

Further, after finishing the burn-in test, only those semiconductors 10 determined to be defective through the burn-in test can be removed from the receiving portions 40 of the semiconductor carrier tray 40, and non-defective semiconductors 10 can be sent to the final operation check test (final test) as they are without being extracted from the semiconductor carrier tray 40 even once during the test.

That is, while the conventional burn-in test method requires much time and trouble in the preparatory or post-processing stages due to the necessity to mount or remove the individual semiconductors 10 in or from the IC sockets one by one, according to the present invention, the simple operation of accommodating the semiconductor carrier tray 40 retaining the semiconductors 10 into the accommodating portion 27 of the housing 25 or placing it on the burn-in board 60, or removing the defective semiconductors 10 from the semiconductor carrier tray 40 suffices, thereby reducing the time and trouble required for the burn-in test.

It should be noted that the applications of the inspection device and inspection method according to the present invention are not limited to the burn-in test. For example, they can also be applied to the final operation test (final test) carried out after the burn-in test is finished. That is, when the final operation check test is carried out with the respective semiconductors 10 being accommodated in the semiconductor carrier tray 40, only the semiconductors 10 that have passed this test can be shipped to personal computer manufacturers or the like while being accommodated in the semiconductor carrier tray 40.

This allows dedicated test providers (burn-in test providers) to ship the semiconductors purchased from semiconductor manufacturers to personal computer manufacturers without extracting them from the semiconductor carrier tray even once, whereby there is no need to perform a complicated operation that requires time and trouble, such as the operation of loading the semiconductors, thereby enabling the burn-in test and the subsequent final operation test to be carried out with extremely high efficiency.

Furthermore, as shown in FIG. 14, the semiconductor carrier tray 40 according to the present invention can be reused in the cycle from the semiconductor manufacture to the semiconductor test provider, and then back to the semiconductor manufacture.

That is, the semiconductor carrier tray 40 that has been used by the personal computer manufacturer can be passed to the semiconductor manufacturer again, whereby the semiconductor carrier tray 40 can be reused in an efficient manner.

Further, after bare chips cut out from a wafer are packaged into semiconductors, the semiconductors determined to be defective by the burn-in test are removed, and only non-defective semiconductors are shipped. Accordingly, only those semiconductors which have passed the test can be shipped, thereby achieving an improvement in the yield of the semiconductors manufactured through the series of manufacturing process as described above.

It should be noted that while in the above-described embodiment the description is directed to the case of the bare chip-mounted IC package as the semiconductor, the present invention is not limited to this; the present invention is also applicable to the case where the bare chips themselves are accommodated in the semiconductor carrier tray for inspection.

Further, in the above-described embodiments, the description is directed to the case where, under the assumption that the relay substrate 29 is detachable, the relay substrate 29 is composed of the upper contact sheet 30 having the elastic contacts 33, the lower contact sheet 31 similarly having the elastic contacts 33, and the base 32 provided therebetween. However, in the case where the relay substrate 29 needs not to be detachable, a construction may be adopted in which the elastic contacts 33 are respectively provided to the large number of contact electrodes 26 of the base substrate 22. The relay substrate 29 may be omitted in this case.

Further, even in the case where the relay substrate 29 is used, a construction may be adopted in which instead of the elastic contacts 33, projecting bump electrodes are provided in the lower contact sheet 31, with the contact electrodes 26 on the base substrate 22 and the bump electrodes being soldered together. However, even in this case, it is preferred that the upper contact sheet 30 that becomes the front surface side have the elastic contacts 33, which are elastically connected with the projecting contact electrodes 11 on the semiconductor 10 side.

What is claimed is:

1. A burn-in board comprising: a semiconductor carrier tray having a large number of receiving portions arranged in a planar matrix form, for placing and retaining semiconductors thereon; a base substrate having a large number of elastic contacts arranged on a surface of the substrate; a relay substrate having a large number of elastic contacts provided on, from among both front and back surfaces thereof, at least the front surface, the relay substrate being arranged on the base substrate; and a lid member arranged so as to be opposed to the base substrate, wherein the semiconductor carrier tray is detachably provided between the relay substrate and the lid member.

2. The burn-in board according to claim 1, further comprising: a housing provided on the base substrate, the housing having an accommodating portion accommodating one or both of the relay substrate and the semiconductor carrier tray.

3. The burn-in board according to claim 1, wherein the elastic contacts are symmetrically provided on both front and back surfaces of the relay substrate.

4. The burn-in board according to claim 1, wherein the relay substrate is detachably provided.

5. The burn-in board according to claim 1, wherein segmented small relay substrates are provided on the base substrate on a per-block basis.

* * * * *